United States Patent [19]

Chapman

[11] Patent Number: 5,266,913
[45] Date of Patent: Nov. 30, 1993

[54] SCREENED ELECTROMAGNETIC COIL OF RESTRICTED LENGTH HAVING OPTIMIZED FIELD AND METHOD

[75] Inventor: Barry L. W. Chapman, Birmingham, Ala.

[73] Assignee: British Technology Group USA Inc., Gulph Mills, Pa.

[21] Appl. No.: 750,809

[22] Filed: Aug. 27, 1991

[51] Int. Cl.$^5$ .............................................. H01F 1/00
[52] U.S. Cl. .................................... 335/216; 324/307
[58] Field of Search ............... 335/216, 199, 301, 304; 324/318, 300, 307, 309

[56] References Cited

U.S. PATENT DOCUMENTS

| | | | |
|---|---|---|---|
| 4,794,338 | 12/1988 | Roerer et al. | 335/301 |
| 4,853,663 | 8/1989 | Vermilyea | 335/216 |
| 4,978,920 | 12/1990 | Mansfield et al. | 324/318 |

FOREIGN PATENT DOCUMENTS

| | | |
|---|---|---|
| 0140259 | 10/1984 | European Pat. Off. |
| 0231879 | 1/1987 | European Pat. Off. |
| 2180943 | 9/1986 | United Kingdom |
| 8714434 | 6/1987 | United Kingdom |
| 8714435 | 6/1987 | United Kingdom |

OTHER PUBLICATIONS

P. Manfield & B. Chapman, "Multishield Active Magnetic Screening of Coil Structures in NMR", Journal of Magnetic Resonance, 72, pp. 211-223, (1987).
P. Mansfield & B. Chapman, "Active Magnetic Screening of Gradient Coils in NMR Imaging", Journal of Magnetic Resonance, 66, pp. 573-576, (1986).
R. Turner & R. M. Bowley, "Passive Screening of Switched Magnetic Field Gradients", Phys. E: Sci. Instrum., 19, (1986), pp. 876-879, printed in Great Britain.
P. Mansfield & B. Chapman, "Active Magnetic Screening of Coils for Static and Time-Dependent Magnetic Field Generation in NMR Imaging", J. Phys. E: Sci. Instrum., 19, (1986), pp. 540-545, printed in Great Britain.
B. Chapman & P. Mansfield, "Double Active Magnetic Screening of Coils In NMR", J. Phys. D: Appl. Phys., 19, (1986), pp. L129-L131, printed in Great Britain.
R. Turner, "A Target Field Approach To Optimal Coil Design", J. Phys. D: Appl. Phys., 19, (1986), pp. L147-L151, printed in Great Britain.
R. Turner, "Minimum Inductance Coils", J. Phys. E: Sci. Instrum., 21, (1988), pp. 948-952, printed in the United Kingdom.

Primary Examiner—Lincoln Donovan
Attorney, Agent, or Firm—Workman, Nydegger & Jensen

[57] ABSTRACT

A primary gradient coil and a screen coil for use with the primary coil are constructed to create a substantially null field adjacent to the screen coil and a substantially distortion free linear gradient field adjacent to the gradient coil. A method is disclosed for generating the coils by considering the screen coil to be of infinite length, deriving a Fourier transform of the axial and other components of the field in which the transform is the sum of the permissible harmonic modes on the coil surface in which a coefficient $C_n$ is derived representing the nth harmonic. A perfect screen coil is created and the number of terms $C_n$ selected using least squares optimization until there is no longer a significant change in the resulting field. Examples are given for creating unscreened, screened, linear, axial and transverse gradient field coils.

20 Claims, 5 Drawing Sheets

SCREENED ELECTROMAGNETIC COIL OF RESTRICTED LENGTH HAVING OPTIMIZED FIELD AND METHOD

FIELD OF THE INVENTION

This invention relates to active electromagnetic field screen coils for use with coils of restricted length and a method of optimizing the magnetic fields created by such coils over one proximate volume while maintaining a null field over a second proximate volume.

BACKGROUND OF THE INVENTION

Electromagnetic coil design is of great importance in many fields of physics and engineering. This is particularly true at the present time in Nuclear Magnetic Resonance (NMR) imaging and spectroscopy, where the requirement for precise spatial variation of a variety of magnetic fields is paramount. The most common arrangement of electromagnetic coil structures for use in NMR is illustrated in FIG. 1 in which an NMR system 1 is shown to comprise a control 2 for operating the system, a main coil 3, usually superconducting, which provides a large, uniform, substantially homogeneous magnetic field over a region of interest (ROI) in the center of the structure, and one axial and two transverse linear gradient field coils 4 (only one being shown for purposes of illustration) that are intended to provide three orthogonal gradient fields that vary linearly over the ROI. The gradient coils shown include an active screen coils 5.

Screen, or shielded gradient coils, and occasionally screened main field coils, have become preferred structures for NMR systems. Active screened coils are described in an article entitled *Active Magnetic Screening of Gradient Coils in NMR Imaging* by Mansfield et al. J. of Magnetic Resonance 66, p. 573-576 (1986) which discloses a method of systematically screening static or time-dependent stray fields. In this method extraneous magnetic fields outside the active volume of the field gradient coil systems are nulled, while gradient fields of a desired type are intended to be generated in the ROI. Subsequent developments have resulted in integrated coil systems wherein primary gradient coils and screen coils cooperate with one another to produce the gradient magnetic fields in the ROI adjacent to the primary coil structure while creating the external null field. Screened coils are used to permit a field of a specific predetermined type, such as a uniform field, a linear field, or a field having other desired properties to be created within the ROI adjacent to the primary coil structure, while simultaneously producing a substantially zero field adjacent to the screen coil structure.

In FIG. 2, a cylindrical embodiment of portions of an NMR system are shown in which the screen coil 5' and the primary coil 4' are intended to create a given desired or predetermined type of field in the ROI, while providing a null field in which Bz-0 in the region 6 external relative to screen coil 5'. Screened coils are used to eliminate time dependent eddy currents in proximal conducting structures, and hence the resultant time dependent perturbations of the magnetic field in the ROI. It is known that the inductance of screened coils is identical to that of unscreened coils providing the same primary field, since, by definition for screened coils, all flux lines return within the screen such that there is no net flux anywhere. Further, the resistance of the screen coil is also independent of the numbers of arcs (turns) that comprise it. This property results from the fact that the more turns that are present on the screen portion of the structure, the proportionally greater is the amount of current that must be tapped off into a parallel circuit. The reduction in current in the screen is in direct proportion to the increase in the number of turns. Thus if the number of turns is doubled, the current is reduced by half, while the voltage drop, and thus the resistance, remains constant.

Screening also provides a means of greatly reducing the extent of the stray external field from the main coil structure which otherwise has adverse effects on all electronic devices within the local region. Consequently, it is desirable to eliminate, or at least greatly reduce, this external field. The alternative, using passive screening, requires the use of great masses of ferromagnetic material The significant prior art methods of approaching the general problem of electromagnetic coil design are somewhat arbitrary in their choice of a starting point for the calculation of the surface current distributions of the coils of interest. As a result, the computations tend to be cumbersome and relatively slow, and the resulting coils do not generate optimal fields.

The general problem of electromagnetic coil design is one of solving the Biot-Savart equation set forth below as Equation 1, wherein the quantities B, $\mu$, and J are vector quantities having three orthogonal spatial components:

$$B(r) = \mu/\pi \int \frac{J(r)(r-r')}{|r-r'|^3} \cdot r' \qquad \text{Equation (1)}$$

where B is the resultant magnetic field at the point r due to the current density distribution J(r') flowing at all points r' within the region of interest, and $\mu$ is the magnetic permeability of the medium.

Solving the Biot-Savart equation to obtain the magnetic field for a given current distribution, in all but a few very simple cases, has until recently, relied upon numerical integration methods. Solving the reverse problem, that of determining a particular current distribution to produce a desired magnetic field, is more difficult. Frequently, and particularly in the design of electromagnets for NMR, fields are generated by coils wound upon a cylindrical former.

Until recently, solutions of the Biot-Savart equation for such coils were obtained by expanding the magnetic field in terms of spherical harmonics and optimizing the first few non-zero terms at the origin. This method has been in use for over a century and has resulted in the standard Helmholtz and Maxwell coils for uniform and linear axial gradient field designs, respectively. This system generates designs which are essentially a series of line current elements at particular spatial locations.

According to Ampere's law, any theoretically achievable magnetic field can be generated in a region by a corresponding current distribution on a surface enclosing that region. For cylindrical coils, this involves surfaces which are either of infinite length or are closed. For practical reasons, in NMR where access to the space within the coil is essential, the cylinders must be relatively short and open-ended. As a result, the practically achievable magnetic fields, while better than those derived by spherical harmonic expansion, are not perfect, but exhibit distortion from desired field parameters. Therefore, optimization is based on assumptions and compromises which result in undesired distortion of the resultant screen-primary coil generated field in the ROI, or in compromising the null value of the external field, by generating a significant stray field in the null region.

Exact solutions of the Biot-Savart equation of Equation 1, which take into consideration its convoluted nature, were initially derived to solve the problem of eddy current formation in structures external to gradient coils in NMR systems. These solutions have subsequently been applied to the problem of gradient coil design by Turner in 1986 in an article entitled *A Target Field Approach to Optimal Coil Design*, J. Phys. D:Appl. Phys. 19 (1986) L147–L151, and to integrated shielding gradient coil design in an article by Mansfield et al. entitled *Multishield Active Magnetic Screening of Coil Structures in NMR*, J. Mag. Resonance 72, 211–223 (1987).. In these latter two cases a suitable (convergent at infinity) "target" field is chosen for the primary gradient field. The choice of such a field is completely arbitrary and does not consider the invariably finite length of the primary coil surface. This results in distortions in the resultant generated field.

In an article by Turner et al., *Passive Screening of Switched Magnetic Field Gradients*, J. Phys. E. Sci. Instrum. 191 (1986) p. 987–879, a thick cylindrical conductor sleeve is disclosed for passive screening of magnetic field gradients. However, currents induced in such sleeves decay with uncontrolled relaxation times, interfering with the NMR imaging. The decaying current produces image fields superimposed on the desired gradient field, thereby introducing artifacts which can run the image.

An article by Mansfield et al. entitled *Active Magnetic Screening of Coils for Static and Time-dependent Magnetic Field Generation in NMR Imaging*, J. Phys. E: Sci. Instrum 19 (1986) p. 540–545, discloses a set of current carrying conductors or a discrete wire array used to simulate the induced surface currents which occur in high conductivity thick metal screens placed around coils producing time-dependent fields or field gradients. Strong external fields are made arbitrarily low making it feasible to generate large, rapidly switched gradients within and in close proximity to a superconducting magnet, which is especially useful in NMR imaging. The active screen may comprise a set of conductors or a mesh of equally spaced wires in which a current pattern is externally generated to mimic an induced surface current distribution. An alternative arrangement is one in which the screen wires carry the same current but the wire spacing is unequal. It is disclosed that the field outside the active screen is substantially nulled. However, the problem of obtaining an optimum field in the region of interest (ROI) is not addressed. A disclosure corresponding to these articles appears in British Patent 2,180,943. This patent discloses the active screen as a complete reflector of the magnetic shaped to provide an aperture for access to the volume enclosed by the active screen.

European Patent 0231879 presents an alternative to the above solutions and discloses the optimization of a screen coil by adding terms from a second cylindrical surface. However, the length of the screen coil is a severe constraint. The use of the total available coil length is almost always unsuitable for designing the screen coil parameters. This is because the requisite number of harmonic wavelengths are not necessarily aliquot to this length. As a result, the fields generated by coils of this design exhibit distortion in the presence of the desired null field. A further problem with this approach is that it compromises the null field. Therefore, to eliminate the distortion in the generated field, the null field value is compromised to a non-null value, which can have deleterious effects on the generated field in the ROI.

SUMMARY OF THE INVENTION

A screen coil and method according to the present invention optimizes the generated field to as given desired condition to provide minimal distortion while simultaneously providing a null field outside a region of interest in an open coil of restricted length. In accordance with the present invention, an electromagnetic coil construction for creating a magnetic field of a given predetermined type comprises a screening electromagnetic coil and an open primary electromagnetic coil of restricted length. The coils are constructed such that the current distributions in the coils are determined by least squares optimization of the current amplitudes of n harmonics of the two-dimensional Fourier transform of the Biot-Savart equation, thereby to create a substantially null magnetic field in one volumetric region adjacent to the screening coil, while a field of the given predetermined type is created in a second volumetric region adjacent to the primary coil that exhibits minimal distortion.

In accordance with one embodiment of the present invention coils are constructed on two cylindrical surfaces, the inner of which is the primary coil of preassigned length and the outer of which is a screen coil of length 1. Length 1 encompasses a significant portion g of the total current of that coil, and the current distributions which the coil structure approximates are such as to provide simultaneously a null magnetic field external to the screen coil surface and a magnetic field optimized on a least square basis within a given region of interest (ROI) within the primary coil, thereby to provide thereat a field of a given predetermined form.

Figure 11A:
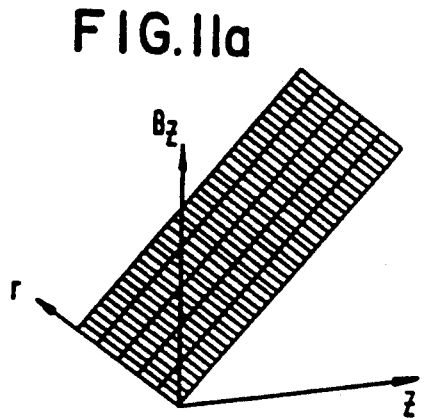
FIG. 11a shows the substantially undistorted linear field variation Bz over a region of interest (ROI) for the screened axial gradient coil current distributions shown in FIGS. 9a and 9b.

FIG, 11b shows the distorted linear magnetic gradient field provided by a prior art Maxwell coil of radius equal to that of the inventive primary coil used to produce the field depicted in FIG. 11a.

Figure 12A:
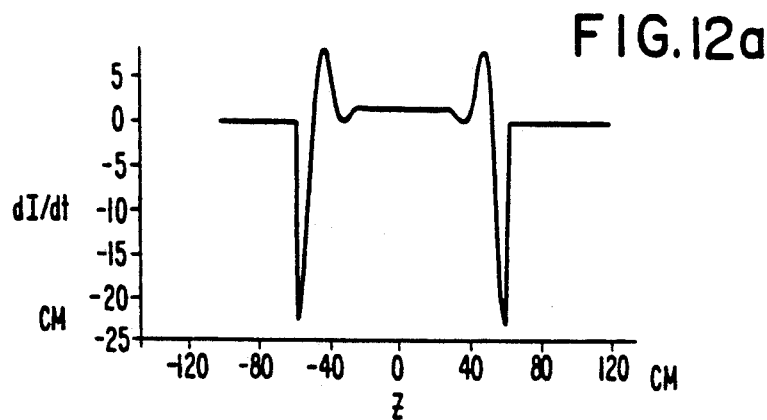
Figure 12B:
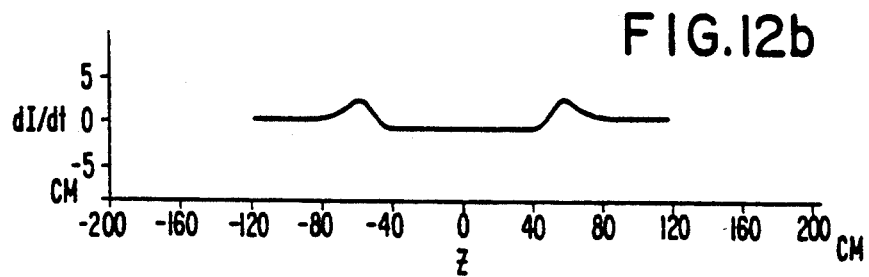
Figure 13:
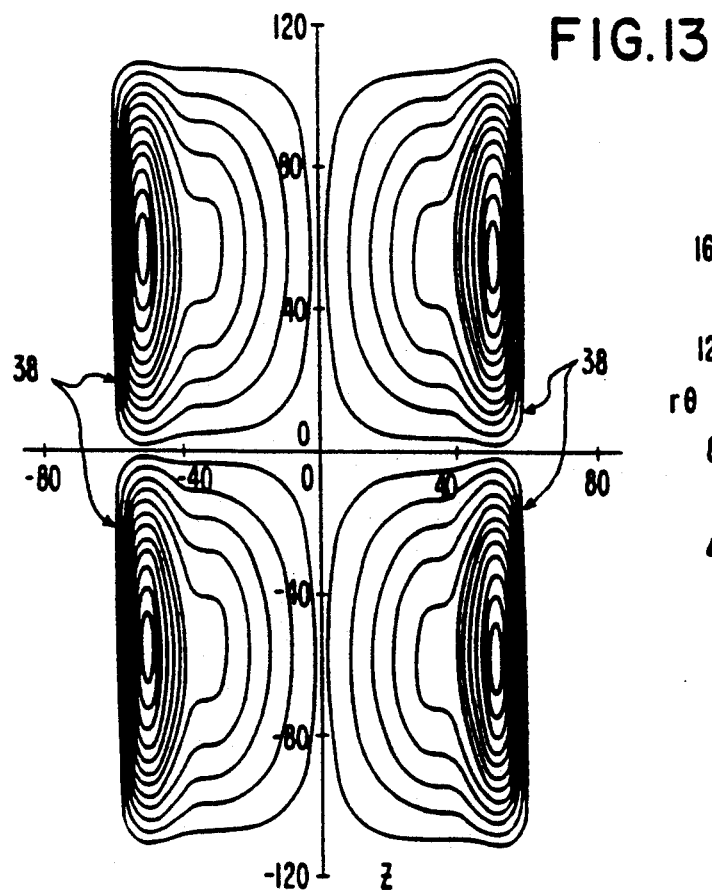
Figure 14:
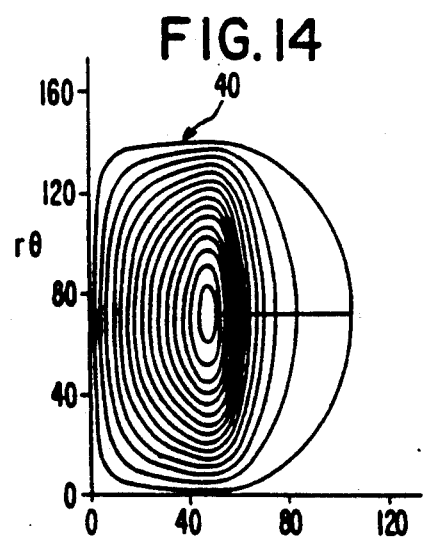

FIGS. 12a and 12b illustrate coil current distributions on primary and screen cylindrical coil surfaces utilizable to provide a screened linear transverse gradient magnetic field within a region of interest (ROI) and a null external field;

FIG. 13 shows iso-contours of the screened transverse gradient coil primary current distributions of FIGS. 12a and 12b, respectively, on a cylinder unrolled in the azimuth direction to show all four quadrants in accordance with an embodiment of the present invention; and FIG. 14 is an unrolled flat view of a quadrant of a screen coil current distribution in accordance with an embodiment of the present invention.

DESCRIPTION OF THE PREFERRED EMBODIMENTS

Figure 1:
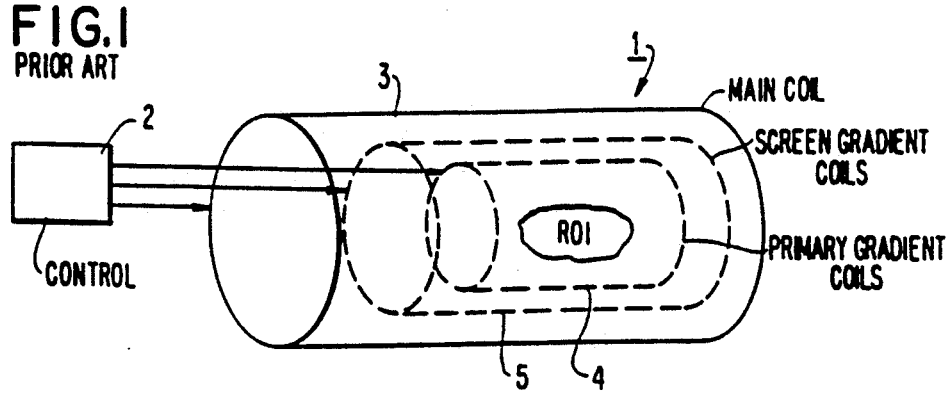
FIG. 1 is a diagrammatic representation of a prior art electromagnetic coil structure in an NMR system.

In FIG. 1, NMR system 1 includes a control 2 the construction of which is well known and will not be further described in detail herein. The control includes the appropriate power sources including rf for energizing the coils of the system. System 1 includes a main outer coil 3 commonly used in NMR imaging systems to create a relatively large static magnet field in a region of interest (ROI), usually the region for receiving a patient to be examined by NMR images. The outer coil 3 is the main coil generating the status B field for the system. Primary gradient coil 4 represents a plurality of gradient coils which generate the axial and transverse gradient fields for imaging purposes in a known way in NMR systems. The screen gradient coils 5 are the active screening coils used to cancel the fields created by the gradient coils 4 in order to screen the surrounding metal structure.

The outer coil 3 usually is superconducting and occasionally screened (not shown). Outer coil 3 provides a large, uniform substantially homogeneous magnetic field over the ROI at the center of the structure, outer coil 3 thus functioning as a magnet. Within this magnet resides one axial and two transverse linear gradient coils represented by coils 4. Coils 4 are intended to provide three mutually orthogonal gradient magnetic fields that vary linearly over the ROI.

Figure 2:
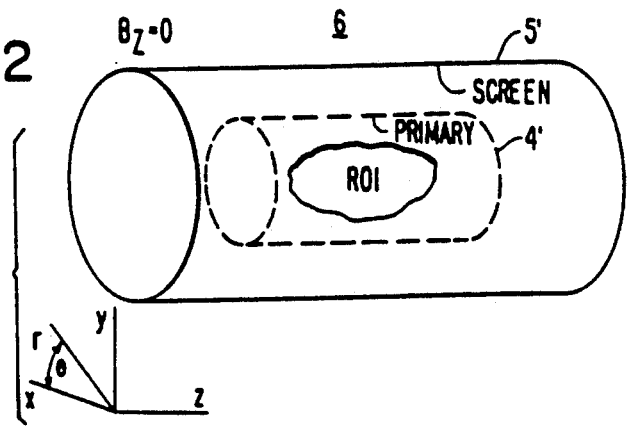
FIG. 2 illustrates in diagrammatic form a generalized prior art screened coil arrangement for providing a field in one region of interest (ROI) of a given predetermined type, and for providing a substantially zero external field.

Screen electromagnetic coils 5 cooperate with the gradient coils 4 to generate in the ROI a magnetic field of a specific predetermined type, such as a uniform, linear, or other desired field, while simultaneously providing a substantially zero (null) field in an external region 6, shown in FIG. 2. The screen and primary coils obtain these characteristics by having requisite current distribution flowing on their primary coil and screen coil surfaces. These are shown here in one preferred embodiment as inner and outer circular cylindrical surfaces.

Figure 11B:
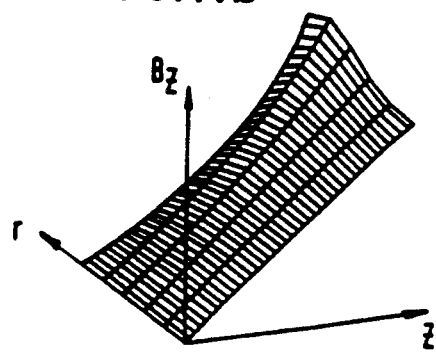

The term "distortion" herein means a field that is different than that which is intended. For example, FIG. 11a illustrates a substantially linear gradient field but FIG. 11b illustrates a significantly distorted linear gradient field, in which the field is non-linear. Additionally, the open coil of interest in NMR systems exhibits leakage flux which is a more difficult problem to resolve in such a coil than in a closed coil.

European patent 87101198.7 proposes a form of least squares optimization of a screened coil involving adding terms from a second cylindrical surface. However, the choice of the length of the screen is arbitrary. The use of the total available screen length is almost always unsuitable, as the requisite harmonic wavelengths for adequate screening are not necessarily multiples of this screen length. The prior methodology requires an assumption of a given screen coil length prior to performing the coil design calculations. Necessarily, this assumption is invariably incorrect.

According to the present invention, it is recognized that for the purposes of calculation, the screen coil can be assumed to be of infinite length. As a result, a perfect screen coil can be arrived at. Such a screen coil is one that with the primary coil creates a null field in a first adjacent region and a substantially distortion free field of a given predetermined type in a second adjacent region of interest (ROI). The current in the screen coil will diminish rapidly beyond the axial limits of the primary coil, and the length of the screen coil can be determined retrospectively to impact insignificantly on the derived magnetic fields. As a result, no constraints are placed upon the screen coil design, and a solution is readily obtained in which a more perfect screen produces a substantially zero external field as compared to prior art systems.

The Biot-Savart equation set forth above in Equation 1 states that the magnetic field B is given by the convolution of the current density distribution J, with the inverse square of the distance $r/[r]^3$. Therefore, Equation 1 can be greatly simplified by Fourier transform into a simple product in the Fourier Kernal space as follows:

$$B(s) = \mu J(s) s |s|^2 \qquad \text{Equation (2)}$$

where B(s) is the Fourier transform of the field B(r), and J(s) is the Fourier transform of the current distribution J(r), both at the point s, which is the general point of the Fourier Kernal space for which point in that space r is the general point vector.

Utilizing this property permits the development of electromagnetic coils with improved gradient linearity and extent relative to prior coil structures, and therefore, to the development of improved screened gradient coils. The analytic design of coils utilizing this property has relied on the choice of a suitable function for the field in combination with the somewhat arbitrary assumption regarding axial variation that the resultant current distribution diminishes to zero at infinity. Although the choice of a suitable function is simple, it is also arbitrary, and consequently the resultant field is less than optimal.

In NMR, the main field magnets are mostly cylindrical in form, consequently, the following analysis will be presented for cylindrical coils, although much of the analysis is equally applicable to other geometries as will eventually be explained below.

THE ELEMENTAL PRIMARY CURRENT HOOP

Of particular importance in the solution of the Biot-Savart equation for coils wound on a cylindrical surface is the field from a hypothetical elemental current hoop of unit current amplitude which varies azimuthally as $\cos(m\Theta)$ that is the field varies as the permissible azimuthal harmonic modes. For simplicity, the following is confined to the determination of the axial component of the field, which will be defined simply as B, and the corresponding azimuthal current J. The other components of the current distribution, and consequently the field magnetic components, can be immediately derived from the continuity equation, Div. J=0. Taking the two-dimensional Fourier transform (2DFT) of this relationship results in the following:

$$B_h(r, m, k) = \begin{cases} \mu\, k\, a\, I'_m(ka)\, K_m(kr), & \text{where } r > a \\ \mu\, a\, I_m(kr)\, K'_m(ka), & \text{where } r < a. \end{cases} \qquad \text{Equation (3)}$$

In Equation (3) above $B_h$ is the axial component of the Fourier transform in the azimuthal and axial directions of the magnetic field at radius r (not to be confused with vector position r), k is the Kernal space dimension corresponding to the axial dimension z, a is the radius of the hoop, and $I_m$ and $K_m$ are the modified Bessel functions, and $I'_m$ and $K'_m$ are the derivatives of each, respectively.

It is apparent from the foregoing that all solutions on a cylinder are simply convolutions of the elemental current hoop with a purely axial distribution function. For an open cylinder of restricted length L, this current distribution can be expressed as the sum of the permissible harmonic modes, n, on the surface as follows:

$$J_\Theta(a, z) = \sum_n C_n H(z) \cos(2\pi n z/L + \phi), \qquad \text{Equation (4)}$$

where $C_n$ is the current amplitude of the nth harmonic and H(z) is the unit step function given by the following:

$$H(z) = \begin{cases} 1 & |z| \leq L/2 \\ 0 & |z| > L/2 \end{cases} \qquad \text{Equation (5)}$$

The Fourier transformation of Equation 4 in the z direction yields the following:

$$J_\Theta(a,k) = \pi L \Sigma_n C_n [e^{i\phi} \text{sinc}(KL/2 - n\pi) + e^{-i\phi}\text{sinc}(KL/2n\pi)] \qquad \text{Equation (6)}$$

The Fourier transformation of the resultant axial field in the azimuthal and axial directions is given by:

$$B(r, m, k) = J_\Theta(a, k) \cdot B_h(r, m, k) \qquad \text{Equation (7)}$$

Optimization of the coil design is then conveniently solved by least squares minimization of the first few terms ($C_n$) over the region of interest (ROI) in real, as against Kernal, space. The choice of the number of terms is dependent upon the geometries of the coil structure and the ROI. This can be addressed by solving with increasing numbers of terms ($C_n$) until the cross term coefficient matrix becomes singular to, for example, one part per million, at which point no further significant improvement can be obtained.

SCREENED ELEMENTAL CURRENT HOOP

The resultant Fourier transform in the azimuthal and axial directions for the internal field of an implicitly screened hoop is given by the substitution of Equation 3 and 6 into Equation 7 as follows:

$$B_s(r, m, k) = \mu_o k\, a\, I_m(kr)[K'_m(ka) - K'_m(kb)I'_m(ka)/I'_m(KB)], \qquad \text{Equation (8)}$$

where b is the radius of the infinite screen. The external field is by definition zero.

The permissible harmonics of the primary surface of radius a, $\cos(2\pi n z/L)$, which results in the axial component of the internal field for convenient two-dimensional Fourier transform (2DFT) is obtained by substituting $B_s$ for $B_h$ in Equation 7 to produce the following:

$$B(r, m, k) = J_{T3}(a, k) \cdot B_s(r, m, k) \qquad \text{Equation (9)}$$

Optimization of the coil design is then conveniently solved as before for the unscreened case on a least squares basis for the harmonic current amplitudes $C_n$, without the addition of any new terms. Practically, the length of the screen coil must be finite, but as the current distribution will fall off rapidly beyond the length of the primary coil, the screen coil length can be limited to the length at which the current distribution amplitude becomes negligible. In this way no priori limitation is imposed upon the screen coil that would impair, or even inhibit a solution for the coefficients. Nor will this current method compromise the screening or the field produced over the ROI.

A significant reduction in the number of coefficients can be achieved by incorporating an unconvoluted term in the series, that is by adding a component representing the field from the current distribution for a flat surface. Examples are the field from a constant current distribution, when a uniform field is required, and the field from a current distribution that varies linearly, when a linear axial gradient field is required.

The following is employed to determine the current distributions for either unscreened or screened coils structures.

a) Set the values for the physical constants, specifying the positions of the primary surface and screen surface, if required, the extent of the primary coil, and the ROI. The ROI is specified as a lattice of points over which the optimization is to be performed. For example, a screened cylindrical coil structure is specified by the screen coil radius b, the primary coil radius a, and the primary coil length L. A convenient ROI is a cylindrical volume. Symmetry considerations and perfect azimuthal variation permit such a cylindrical volume to be specified by p radial and q axial positions from the origin outward, provided that p.q> the number of unknowns, $C_n$.

b) Determine the magnetic field from unit current amplitude of each of the appropriate harmonics given by the inverse Fourier transform of the individual terms of the magnetic field stated in Equation 7, as suitably modified for screened systems. For example, if a transaxial gradient is required on a cylinder, only the cos ($\Theta$) azimuthal variation is required, and only even longitudinal terms, cos ($2\pi nz/L$), with n>0, need be considered for reasons of current continuity [return path].

c) The least squares optimization is then performed with increasing number of coefficients until no significant improvement in the field in the ROI can be obtained. For the cylindrical example 2, 3, 4, etc. terms are incorporated into the coefficient matrix, until the matrix becomes non-singular to 1 part per million (ppm), at which point no further significant improvement is obtainable.

d) The significant coefficients are then used to determine the total current distribution, as given by Equation 4.

e) Equipotential contours are then determined in the axial and azimuthal directions. These contours are then utilized as the basis for the practical manufacture of a corresponding coil structure.

The following examples constitute the three primary fields required for the performance of NMR:
1. Uniform magnetic field
   a. Unscreened,
   b. Screened
2. Linear axial gradient field
3. Linear transverse gradient field.

The method of the present invention is immediately applicable to similar coil geometries and all ROI geometries. Further, the method can be readily generalized to other open geometries, for example flat surfaces.

In all of the following examples, a cylindrical ROI of a diameter 55 cms radius and 40 cms length was used, and least squares optimization was performed over six evenly spaced radii therewithin.

The choices of a cylindrical ROI and all dimensions is arbitrary.

UNSCREENED UNIFORM MAGNETIC FIELD COIL

For the purpose of this example, a cylindrical coil structure of 140 cms in diameter restricted to a length of 200 cms is assumed.

Figure 3:
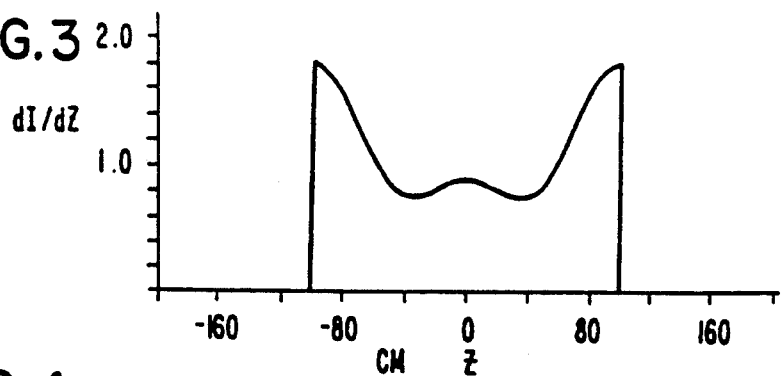
FIG. 3 illustrates an unscreened magnetic field coil current distribution in which the amplitude is constant in the azimuth direction normal to the drawing sheet on the surface of a cylinder optimized in accordance with the present invention to provide a uniform field over a cylindrical region of interest (ROI)

Least squares optimization over the ROI was achieved in the manner described above with the first three harmonic terms C0, C1 and C2. FIG. 3 shows the unscreened magnetic field coil current distribution (mega amps per meter per tesla on the vertical axis versus cms on the horizontal axis) on the surface of a cylinder of diameter 140 cms and length 200 cms, optimized to provide a uniform field on a cylindrical ROI of diameter 55 cms and length 40 cms. FIG. 3 thus shows the current distribution that will provide such a uniform magnetic field with the amplitude of this current distribution being constant in the azimuthal direction. This distribution can be achieved by the suitable placement of conductors by a method as described in the literature. The two most common embodiments of such a method involve the use of either (1) conductors of uniform cross section but varied spacing, or (2) equally-spaced conductors of varying width in the axial direction. In both cases, the conductors are wound azimuthally and in series. In both cases the thickness of the conductors is assumed to be small compared to the diameter of the coil.

Figure 4:
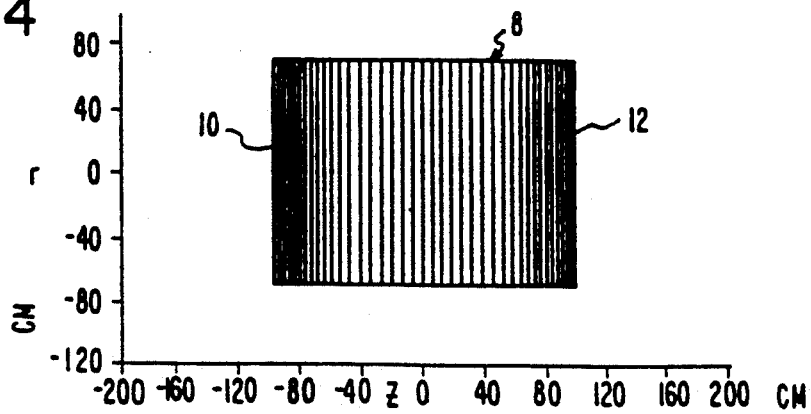
FIG. 4 illustrates a practical means of achieving the current distribution of FIG. 3, wherein the lines in FIG. 4 represent a series-connected structure of conductors the spacings of which are given by equally spaced contours on the integral of the current distribution of FIG. 3.
Figure 5:
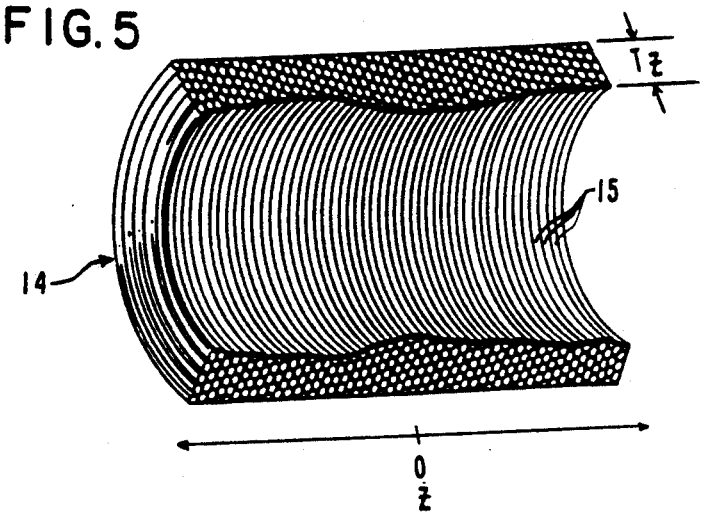
FIG. 5 is a sectional elevation view of an embodiment of a coil construction for generating a large uniform field in which the radial thickness of the coil is proportional to current distribution and those thicknesses have been exaggerated in comparison with the radius for purposes of illustration.

One means of practically achieving the uniform field is to place series-wound conductors of uniform thickness along the lines of uniform thickness, but varied spacing, illustrated in FIG. 4. A second means for achieving the same field is to place conductors of thickness in the axial direction corresponding to the spacing between the lines shown in FIG. 4, again connected in series. In the latter case the lines shown in FIG. 4 represent in effect a spacing of uniform thickness between each 'loop' of the coil. FIG. 4 is a side view of a coil 8 utilizing this arrangement with 40 or 41 turns for the conductors of uniform and non-uniform thickness, respectively. The two extra turns in the latter case are formed by the ends 10, 12 of the structure which as shown in FIG. 4 are open. The front view of the structure taken from either side of FIG. 4 would be circular. In an actual embodiment the number of turns for the main field would be several orders of magnitude more than those depicted in FIG. 4. The use of uniform wires wound in such a way as to form a coil 14 having a variable radial thickness $T_z$ proportional to the current distribution of FIG. 3 is shown in FIG. 5 as an alternative, but convenient means of achieving the same result.

Figure 6A:
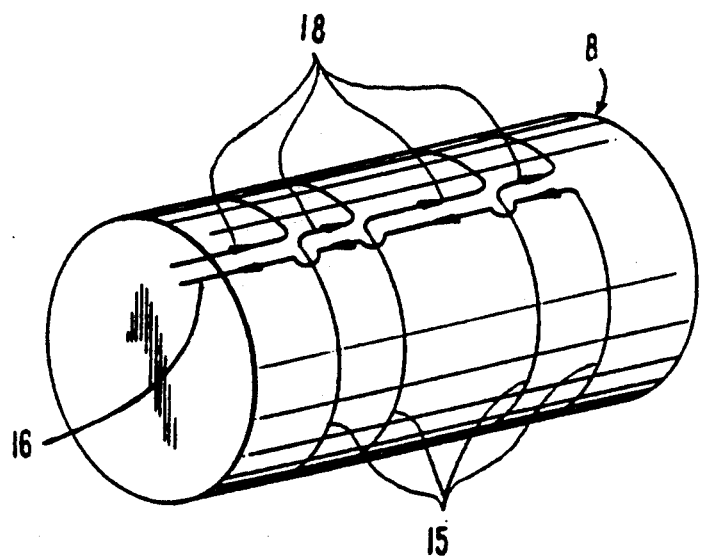
FIGS. 6a and 6b illustrate the coupling of coil sections between successive turns of axial and transverse coil structures, respectively.
Figure 6B:
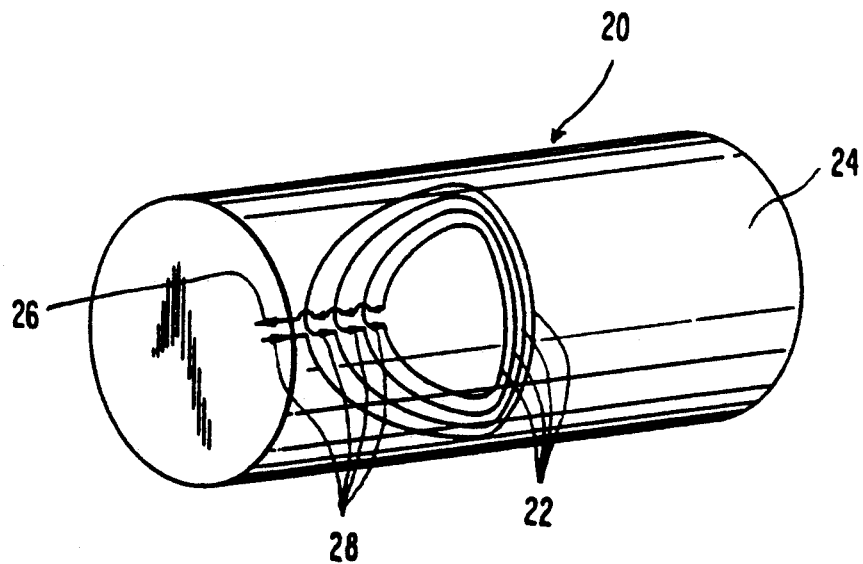

The contribution from connecting sections between successive turns 15 of the conductor in coil 8 of FIG. 4 can be made negligible by placing the return path 16 adjacent to the incoming lines 18, as sown in FIG. 6a. A similar approach relative to a flat coil 20 of turns 22 of a conductor disposed on a cylindrical surface 24 is shown in FIG. 6b relative to a return path 26 and incoming lines 28.

SCREENED UNIFORM MAGNETIC FIELD COILS

For the purpose of this example, a cylindrical coil structure of 140 cms in diameter restricted to a length of 200 cms is assumed for the primary coil, and a cylindrical coil structure of 200 cms diameter is assumed for the screen coil.

Figure 7A:
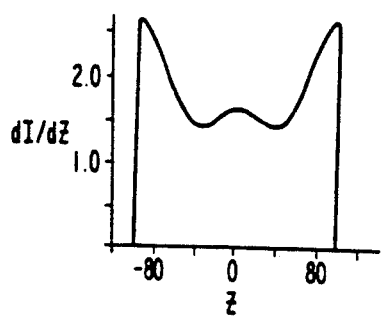
FIGS. 7a and 7b illustrate current distributions for respective primary and screen coil surfaces utilizable to provide a uniform magnetic field within a region of interest (ROI) and a null external field.
Figure 7B:
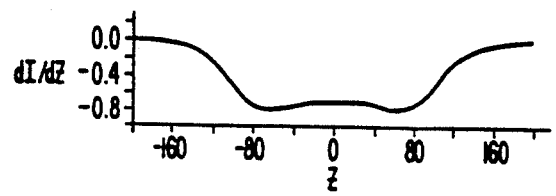

Least squares optimization over the ROI is achieved with the first three harmonic terms. FIG. 7a shows the current distribution for the primary coil, and FIG. 7b shows the current distribution for the screen coil that will together simultaneously provide a uniform magnetic field within the ROI and a zero field external to the screen at r>100 cms. The amplitudes of both of the current distributions in FIGS. 7a and 7b are constant in the azimuthal direction. These distributions can be achieved in an identical manner to any of those proposed for the unscreened coil of the types described relative to FIGS. 3-6a above.

Figure 8A:
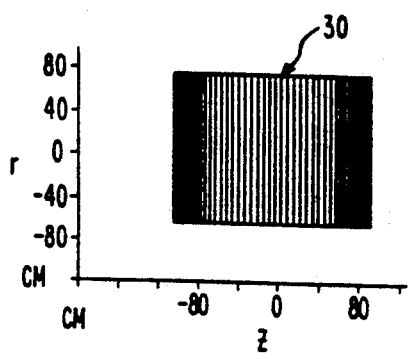
FIGS. 8a and 8b illustrate a practical means of achieving the current distributions of FIGS. 7a and 7b, respectively, wherein the lines in FIGS. 8a and 8b represent a series-connected structure of conductors, the spacings of which are given by equally spaced contours as the integrals in the axial direction of current distribution curves of the primary and screen surfaces depicted in FIGS. 7a and 7b, respectively.
Figure 8B:
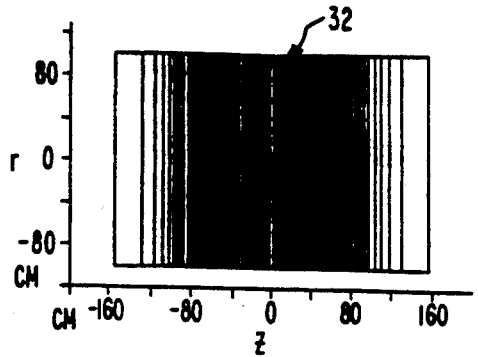

FIGS. 8a and 8b show a series of equally-spaced contours 30 and 32 on the integral of the current distribution curves of the primary coil and the screen coil surfaces, respectively. These are useable to produce actual coil windings capable of achieving the current distributions of FIGS. 7a and 7b, respectively, in any of the manners already discussed relative to the use for that purpose of FIG. 4 above.

SCREENED LINEAR AXIAL GRADIENT MAGNETIC FIELD COIL

For the purpose of this example, a cylindrical coil structure of 70 cms in diameter restricted to a length of 120 cms is assumed for the primary coil, and a cylindrical coil structure having a diameter of 90 cms is assumed for the screen coil.

Figure 9A:
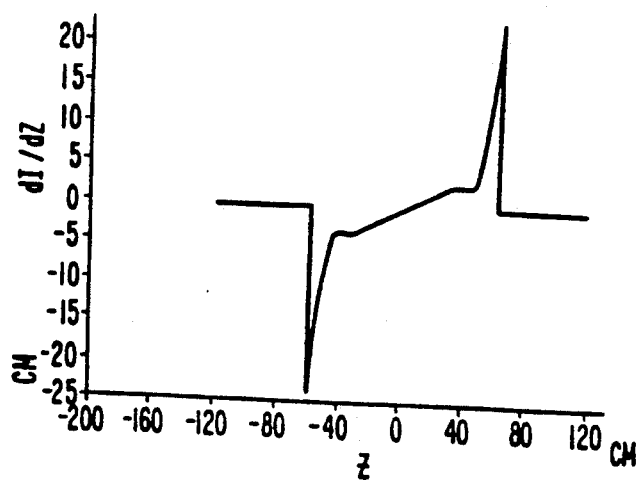
FIGS. 9a and 9b illustrate current distributions for respective primary and screen cylindrical coil surfaces utilizable to provide a linear axial gradient magnetic field within a region of interest (ROI) and a null external field.
Figure 9B:
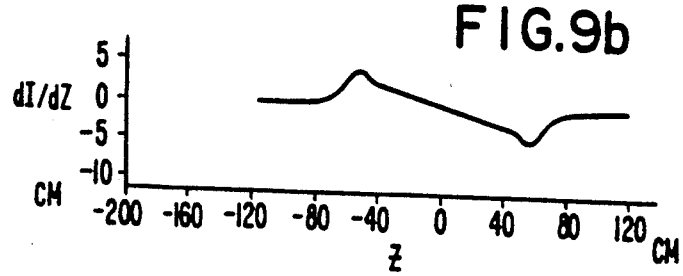
Figure 10A:
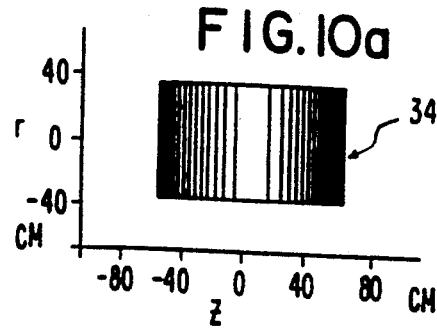
FIGS. 10a and 10b illustrate a practical means of achieving the current distributions of FIGS. 9a and 9b, respectively, wherein the lines in FIGS. 10a and 10b represent a series-connected structures of conductors the spacings of which are given by equally spaced contours of the integrals of the current distribution curves of the primary and screen coil surfaces depicted in FIGS. 9a and 9b, respectively.
Figure 10B:
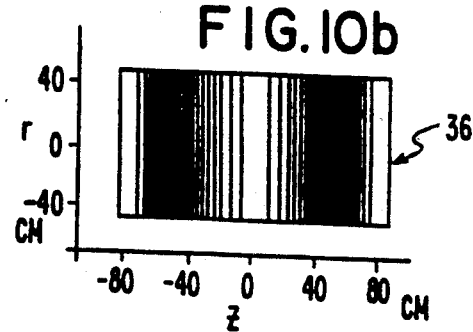

Least squares optimization over the ROI resulted in the current distribution shown in FIGS. 9a for the primary coil and the current distribution shown in FIG. 9b for the screen coil. The corresponding equipotential contours, or equal coil windings, are respectively shown in FIG. 10a for a primary coil 34 and in FIG. 10b for a screen coil 36. These current distributions together provide a magnetic field which varies linearly with distance along the Z-axis in the ROI, as shown in FIG. 11a, and a zero field external to the screen coil at $r > 45$ cms. The amplitudes of both current distributions are constant in the azimuthal direction. For comparison purposes FIG. 11b shows the distorted linear magnetic gradient field provided by a prior art Maxwell coil arrangement of radius equal to the radius to the primary coil 34 used to produce the linearly varying field illustrated in FIG. 11a.

SCREENED LINEAR TRANSVERSE GRADIENT MAGNETIC FIELD COIL

In this example, a cylindrical coil structure of 70 cms in diameter restricted to a length of 120 cms is assumed for the primary coil, and a cylindrical coil structure having a diameter of 90 cms is assumed for the screen coil.

Least squares optimization over the ROI results in the current distribution shown in FIGS. 12a for the primary coil and the current distribution shown in FIG. 12b for the screen coil. These current distributions provide a magnetic field in the axial direction which varies linearly with distance along the radius in the ROI and is zero external to the screen coil at $r > 45$ cms. The amplitudes of both current distributions vary consinusoidally ($m = 1$) in the azimuthal direction. FIG. 13 shows four quadrants where the surface has been unrolled to display the contour on the flat axial and circumferential plane of the four components 38 of the primary coil in the corresponding equipotential contours, or equal coil windings, required to effect the current distribution shown in FIG. 12a. FIG. 14 shows the unrolled view of a quadrant one component 40 of the associated screen coil unrolled to display the contour of the flat axial and circumferential plane of the screen coil of the corresponding equipotential contours, or equal coil windings required to effect the current distributions shown in FIG. 12b. Windings of the types illustrated in FIGS. 12a and 12b assume a three-dimensional appearance like those of coil 20 on cylindrical surface 24 shown in FIG. 6b.

GENERALIZED SOLUTION

The foregoing has concentrated on the application of solutions over a specific ROI. For each ROI the problem must be reworked. As with the designs based on spherical harmonics, solutions exist which are scale independent, provided some loss of optimization is tolerated. A general solution can be achieved for surface current distributions by determining the current distribution required to provide the desired field at the surface of the conductor. The resultant design can subsequently be scaled. Such a solution is akin in effect to that of introducing super conducting or highly conductive surfaces into a constant or rapidly changing magnetic filed in the design of unscreened gradient coils, as discussed in UK Patent 8714435.

This general 'super-conducting' solution can be obtained with an iterative procedure starting from a current distribution which is simple proportional to the magnetic field required, as in the case of solutions for a flat surface. There successive approximations for the current distribution J are given by the following:

$$J_{n+1} = J_n (B - B_n)/\mu, \qquad \text{Equation (10)}$$

where B is the desired field at the surface, and $B_n$ is the field from the current distribution $J_n$.

An alternative general solution in the case of cylindrical coils is to base the length of the primary coil on the spacings used in line element solutions. In the case of ROI fields possessed of a uniform gradient or a linear axial gradient, this would require primary coil lengths equal, respectively, to the Helmholtz separation ($a/2$), or to twice the Maxwell separation ($a\sqrt{3}/2$).

The least squares optimization for screened coil design can advantageously be utilized for surfaces of arbitrary shape. The problem becomes more complicated with any loss of symmetry and the need to specify shapes of increasing degrees of arbitrariness in three dimensions. The general, iterative 'super-conducting' process described above also shares these advantages and disadvantages when applied to structures of increasingly arbitrary surface configuration.

Though no efforts have been made to minimize inductance, the disclosed method of the coil design produces coils for which the inductance differs only slightly from the minimal. Minimization can be incorporated into coils designed according to the present invention at some cost to field optimization.

It is anticipated that the inventive method can be implemented in all aspects of electromagnet design where external fields are undesirable. For example, the inventive method may have applications in particle accelerators and for the protection of electronic circuitry, such as computers, located proximate to large magnetic fields. Also, it is expected that the combination of the precise profiling of magnetic fields and the suppression of extraneous fields will become increasingly important with the advancements of superconductor magnet technology, and particularly with the development of higher temperature superconducting materials.

FLAT COILS

If the plane of the current distribution, J, is defined to be normal to the x-axis, then Fourier transformation of the Biot-Savart equation set forth in Equation 1 above in the two dimensions (y, z) gives the following:

$$B(x, v, w) = \frac{\mu o}{2} e^{-|x|q} J(v, w) g,$$

Equation (11)

where, $$g = \frac{x}{|x|} i + \frac{v}{|q|} j + \frac{w}{|q|} k,$$

Equation (12)

and, $$q = (v^2 + w^2)^{\frac{1}{2}}$$

Equation (13)

In Equation 13 above v and w are the Fourier kernal dimensions corresponding to y and z, respectively.

The solutions for any particular restricted geometric shape, such as rectangular, circular, elliptical, and other shapes, can again be derived by simply considering the permissible harmonic modes.

What is claimed:

1. A method of forming an electromagnetic coil construction to produce a substantially null magnetic field in a first volumetric region adjacent to and exterior of the coil constriction and a magnetic field of a predetermined ideal type in a second volumetric region interior of the coil construction, said method comprising the steps of:
   a. forming an open primary electromagnetic coil of restricted length, said primary coil being constructed by least squares optimization of the current amplitudes of a predetermined number of permissible harmonics to provide a current distribution in said primary coil capable of creating the magnetic field of predetermined ideal type substantially free of distortion the second volumetric region, said second volumetric region being located interior of said primary coil; and
   b. forming a screening electromagnetic coil about said primary coil, said screening coil being constructed by least squares optimization of the current amplitudes of a predetermined number of permissible harmonics to provide a current distribution in said screening coil capable of creating in the second volumetric region a substantially null magnetic field, said second volumetric region being located exterior of and adjacent to said screening coil.

2. The method of claim 1, wherein said step of forming an open primary electromagnetic coil comprises the steps of:
   a. determining the field of a current hoop of a given dimension and of unit current amplitude which varies azimuthally as cos (mΘ) in the second volumetric region from the azimuthal current of the hoop by determining the axial component of the two-dimensional Fourier transform in the azimuthal and axial direction of the magnetic field created by the current hoop at a given radius in a kernal space corresponding to the axial dimension of the current hoop at a radius of the current hoop,
   b. deriving the remaining current components,
   c. convolving the resultant current with a purely axial distribution function,
   d. optimizing the convolved current by least squares minimization of said current amplitude over the second volumetric region, and
   e. forming the primary coil on a cylindrical former based on said step of optimizing.

3. The method of claim 1, wherein said step of forming a screening electromagnetic coil comprises the steps of:
   a. determining the field B of a current hoop of a given dimension of unit current amplitude which varies azimuthally as cos (mΘ) in the second volumetric region from azimuthal current J by determining the axial component $B_h$ of the two-dimensional Fourier transform in the azimuthal and axial directions of the magnetic field at radius r in a kernal space K corresponding to the axial dimension the hoop at radius a of the hoop according to the relation:

$$B_h(r, m, k) = \begin{cases} \mu K a \, I'_m(Ka) K_m(Kr), & r > a \\ \mu K a \, I_m(Ka) K'_m(Kr), & r < a, \end{cases} \text{ where}$$

$I_m$ and $K_m$ are modified Bessel functions, and
$I'_m$ and $K'_m$ are the derivatives thereof, respectively,
   b. deriving the remaining current components,
   c. convolving the resultant current with a purely axial distribution function,
   d. optimizing the convolved current by least squares minimization over the one volumetric region, and
   e. forming the screening coil on a cylindrical former based on said step of optimizing.

4. The method of claim 2, wherein said step of convolving comprises the steps of:
   a. expressing the current distribution as the sum of permissible harmonic modes n on the surface of the current hoop, and
   b. Fourier transforming the resultant current distribution in the axial direction.

5. The method of claim 4, wherein said step of Fourier transforming comprises the step of producing a current distribution according to the relation:

$$B(r, m, k) = J_{73}(a, k) \cdot B_h(r, m, k), \text{ where}$$

$B_h$ is the axial component of the Fourier transform in the azimuthal and axial directions of the magnetic field at radius r,
K is the kernal space dimension corresponding to the axial dimension z,
a is the radius of the hoop,
the current distribution on the surface of an open cylinder of length L having harmonic nodes n is provided by:

$$J_\Theta(a, z) = \pi L \sum_n C_n H(z) \cos(2\pi n z/L + \Phi)$$

$J_\Theta(a, k)$ being the Fourier transform of $J_\Theta$ having coefficients $C_n$, where $C_n$ is the current amplitude of the $n^{th}$ harmonic,
the parameters of the coil being derived by solving for least squares minimization of the initial few terms $C_n$ of the latter Fourier transform over the second volumetric region in actual space.

6. The method of claim 1, wherein said step of forming an open primary electromagnetic coil comprises the step of performing successive approximations of the current distribution J of said coils according to the relation:

$$J_{n+1} = J_n + (B - B_n)/\mu, \text{ where}$$

B is the desired field at the surface of the coil, $B_n$ is the field from the current distribution $J_n$, and $\mu$ is the permeability of the space of the second volumetric region.

7. The method of claim 1, wherein the primary and screening coils are formed on cylindrical formers.

8. The method of claim 1, wherein the primary and screening coils are formed as flat coils.

9. An electromagnetic coil construction for creating a substantially null magnetic field in a first volumetric region adjacent to and exterior of the coil constriction and a magnetic filed of a predetermined ideal type in a second volumetric region interior of the coil construction, said coil construction comprising:
   a. an open primary electromagnetic coil of restricted length; and
   b. a screening electromagnetic coil;

said coils being constructed employing least squares optimization of the current amplitudes of the permissible harmonics of a hypothetical primary surface to determine the current distributions in said coils, thereby to produce a substantially null magnetic field in the first volumetric region adjacent to and exterior of the screening coil and the field of said predetermined ideal type in the second volumetric region interior of and adjacent to said primary coil, said field of said predetermined ideal type exhibiting a substantially negligible distortion.

10. The construction of claim 9, wherein the physical configuration of each of said coils is arrived at by the steps of:
   a. determining the field of a current hoop of a given dimension having a unit current amplitude which varies azimuthally as cos (m$\Theta$) in the second volumetric region from the azimuthal current of the current hoop by determining the axial component of the two-dimensional Fourier transform in the azimuthal and axial directions of the magnetic field crated by the current hoop at a given radius in a kernal space corresponding to the axial dimension of the hoop at a radius of the hoop,
   b. deriving the remaining current components,
   c. convolving the resultant current with a purely axial distribution function,
   d. optimizing the convolved current by least squares minimization of said current amplitudes over the second volumetric region, and
   e. forming the coils on respective cylindrical formers based on said step of optimizing.

11. The method of claim 1, wherein said step of forming an open primary electromagnetic coil comprises the step of utilizing a cylindrical former having a primary length that is related to the spacings provided by spherical harmonic analysis.

12. The method of claim 1, wherein said second volumetric region comprises a region of interest (ROI) located immediately proximate to the surface of the primary coil opposite from the screen coil.

13. A coil construction comprising:
   a. a cylindrical primary coil of pre-assigned length; and
   b. a cylindrical screen coil of length l disposed encircling said primary coil in a substantially coaxial relationship therewith, such that the length l of said screen coil encompasses a significant portion g of the total current in said primary coil, said coils being so configured as to produce therein current distributions that provide simultaneously a null magnetic field external to the outer surface of the screen coil and a magnetic field optimized on a least square basis within a given region of interest (ROI) within the primary coil, thereby to provide in said ROI a field of a predetermined substantially distortion-free ideal type.

14. A method as recited in claim 1, wherein said predetermined number of permissible harmonics comprises three harmonics.

15. A method as recited in claim 11, wherein said predetermined ideal type of magnetic field comprises a uniform magnetic field, and said primary length of said cylindrical former comprises a length of a/2.

16. A method as recited in claim 11, wherein said predetermined ideal type of magnetic field comprises a linear axial magnetic field, and said primary length of said cylindrical former comprises a length of $\sqrt{3}/2$.

17. A method as recited in claim 11, wherein said predetermined ideal type of magnetic field comprises a linear transverse gradient field.

18. A construction as recited in claim 13, wherein the magnetic field of said predetermined ideal type comprises a uniform magnetic field.

19. A construction as recited in claim 13, wherein the field of said predetermined ideal type comprises a linear axial gradient field.

20. A construction as recited in claim 13, wherein the field of said predetermined ideal type comprises a linear transverse gradient field.

* * * * *

UNITED STATES PATENT AND TRADEMARK OFFICE
CERTIFICATE OF CORRECTION

PATENT NO. : 5,266,913
DATED : November 30, 1993
INVENTOR(S) : BARRY L. W. CHAPMAN It is certified that error appears in the above-indentified patent and that said Letters Patent is hereby corrected as shown below:

```
Column 1, line 31, "coils" should be --coil--
Column 1, line 58, after "6" insert --is--
Column 2, line 17, after "material" insert --.--
Column 3, line 18, ".." should be --.--
Column  , line 32, "run" should be --ruin--
Column 4, line 11, "as" should be --a--
Column 4, line 31, after "inner" insert --surface--
Column 4, line 66, "those" should be --whose--
Column 5, line 24, "structures" should be --structure--
Column 5, line 24, after "conductors" insert --,--
```

Column 6, line 67, " $B(s) = \mu J(s) s|s|^2$ "

should be -- $B(s) = \mu J(s) \Lambda \frac{s}{|s|}2$ --

Column 8, line 45, "$J_{73}$" should be -- $J_\theta$ --; and
Column 10. line 44, "sown" should be --shown--
Column 14, line 40, "$J_{73}$" should be -- $J_\theta$ --.
Column 15, line 14, "filed" should be --field--
Column 15, line 42, "crated" should be --created--

Signed and Sealed this

Nineteenth Day of July, 1994

Attest:

BRUCE LEHMAN

*Attesting Officer*   *Commissioner of Patents and Trademarks*